(12) United States Patent
Ohsaki et al.

(10) Patent No.: US 7,466,395 B2
(45) Date of Patent: Dec. 16, 2008

(54) EXPOSURE APPARATUS AND DEVICE MANUFACTURING METHOD USING THE APPARATUS

(75) Inventors: Yumiko Ohsaki, Utsunomiya (JP); Akiyoshi Suzuki, Tokyo (JP); Seiji Takeuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 279 days.

(21) Appl. No.: 11/458,767

(22) Filed: Jul. 20, 2006

(65) Prior Publication Data

US 2007/0019175 A1 Jan. 25, 2007

(30) Foreign Application Priority Data

Jul. 22, 2005 (JP) ............... 2005-212917

(51) Int. Cl.
G03B 27/54 (2006.01)
G03B 27/42 (2006.01)

(52) U.S. Cl. .......................... 355/67; 355/53

(58) Field of Classification Search ............. 355/52, 355/53, 55, 67–71; 356/399–410, 515
See application file for complete search history.

(56) References Cited

U.S. PATENT DOCUMENTS

| | | | |
|---|---|---|---|
| 5,355,218 A | 10/1994 | Matsuda et al. | |
| 6,586,168 B1 | 7/2003 | Ohsaki | |
| 6,614,535 B1 | 9/2003 | Kakuchi et al. | |
| 6,650,399 B2 * | 11/2003 | Baselmans et al. | ............ 355/55 |
| 7,336,371 B1 * | 2/2008 | Haidner et al. | ............... 356/515 |
| 2002/0118370 A1 | 8/2002 | Nishida | |
| 2005/0117171 A1 * | 6/2005 | Kato | ........................... 356/521 |
| 2005/0190378 A1 * | 9/2005 | Nakauchi | ..................... 356/515 |

FOREIGN PATENT DOCUMENTS

| | | |
|---|---|---|
| JP | 2000-277412 A | 10/2000 |
| JP | 2003-254725 A | 9/2003 |
| WO | 2004/057295 A2 | 7/2004 |

OTHER PUBLICATIONS

Lexikon Der Optik—M bis Z 1999, Spektrum Akademischer Verlag, Heidelberg, Berlin, XP002457415 p. 288-289; figures 1-3.

* cited by examiner

Primary Examiner—Hung Henry Nguyen
(74) Attorney, Agent, or Firm—Canon USA Inc IP Division

(57) ABSTRACT

An exposure apparatus which includes a projection optical system that projects a pattern image of a reticle onto an object to be exposed, and an interferometer configured to measure an optical characteristic of the projection optical system. The interferometer includes a mask placed on an object plane side of the projection optical system, the mask shaping a wavefront of light from a light source into an ideal wavefront, a detector configured to detect the light passing through the projection optical system; and an optical element placed between the mask and the projection optical system or between the projection optical system and the detector. The detector detects interference fringes (an interferogram) formed by interference between a reflected component of the light reflected by the optical element and a transmitted component of the light passing through the optical element.

10 Claims, 12 Drawing Sheets

WAFER REFERENCE POSITION

FIG. 10A

EXPOSURE APPARATUS AND DEVICE MANUFACTURING METHOD USING THE APPARATUS

BACKGROUND OF THE INVENTION

1. Field of the Invention

The present invention relates to exposure apparatuses, and more particularly though not exclusively, to an exposure apparatus that projects a pattern provided on a reticle (photomask) onto a substrate by exposure in lithography for manufacturing devices such as semiconductor devices and liquid crystal display devices.

2. Description of the Related Art

In recent lithographic processes for manufacturing semiconductor devices and so on, an exposure apparatus has been used to transfer a reticle pattern onto a wafer on which a resist is applied.

Further, the level of integration of integrated circuits has been enhanced, that is, circuit patterns have become finer, and the wavelength of exposure light used in the exposure apparatus has been shortened in order to achieve high resolution. Accordingly, a KrF excimer laser with a wavelength of 248 nm or an ArF excimer laser with a wavelength of 193 nm is currently being used as a light source in the exposure apparatus, instead of a mercury lamp that has been dominant until recently.

On the other hand, high definition can be achieved by increasing the numerical aperture (NA) of a projection optical system in the exposure apparatus. Accordingly, an immersion exposure apparatus has been discussed in which the space between the projection optical system and the wafer is filled with a liquid having a refractive index of more than 1 in order to increase the numerical aperture and to thereby increase the achievable density of circuit patterns.

With increases in the definition of the exposure apparatus, strict requirements have been imposed on aberration correction of the projection optical system installed in the exposure apparatus. For this reason, it can be necessary to measure and inspect the optical characteristics of the projection optical system.

For example, it can be necessary to measure a subtle change in the optical characteristics of the projection optical system caused during transportation of the exposure apparatus and to readjust the optical characteristics to obtain the best characteristics. The necessity of measuring a change in the optical characteristics of the projection optical system, which results from a change in illumination conditions, in the exposure apparatus has been strengthened. The necessity of measuring a change in the optical characteristics caused by the influence of heat generated during exposure of the wafer has also been strengthened.

Japanese Patent Laid-Open Nos. 2000-277412 and 2003-254725 disclose interferometers each of which is installed in an exposure apparatus, allowing the optical characteristics of a projection optical system to be measured in the exposure apparatus. The interferometers can be, for example, a point diffraction interferometer or a shearing interferometer.

In the discussed interferometers, a member having a fine pattern, such as a pinhole, a slit, or a diffraction grating, needs to be placed on each of a reticle side and a wafer side of the projection optical system.

For example, pinholes are sometimes necessary on the reticle side and the wafer side of the projection optical system in a point diffraction interferometer, and a diffraction grating can be necessary on one of the sides. A pinhole or a diffraction grating can be necessary on the reticle side and a diffraction grating can be necessary on the wafer side in a shearing interferometer.

However, in an immersion exposure apparatus, the distance between a projection optical system and a wafer is quite short because immersion liquid is held therebetween. For this reason, it is quite difficult to place a member having a fine pattern and a driving mechanism for driving the member between the projection optical system and the wafer.

In order to generate an ideal wavefront or separate the wavefront by using a fine pattern, machining accuracy for the fine pattern is important. As the numerical aperture of the projection optical system increases, the required density of the pattern increases, machining becomes more difficult, and machining errors arise more easily. When machining errors arise, an obtained wavefront deviates from an ideal wavefront, or the wavefronts are not precisely separated. This may decrease the accuracy in measuring the performance of the projection optical system. In addition to the machining errors, the amount of light passing through the fine pattern is reduced by increasing the density of the pattern. This may also decrease the measuring accuracy.

When a diffraction grating is provided on the wafer side, ±1-order light from the diffraction grating becomes an evanescent wave, that is, no light beam sometimes comes from the diffraction grating.

Although slightly dependent on the pitch of the diffraction grating and the position of the sensor, as the numerical aperture of the projection optical system increases, the shear ratio (the amount of shear between two separated wavefronts) greatly varies depending on the position. Therefore, it is difficult to precisely measure the performance of the projection optical system over the entire pupil plane of the projection optical system.

The reduction ratio of the projection optical system in the exposure apparatus is typically ¼ to ⅙. Therefore, the numerical aperture on the reticle side is lower than on the wafer side. For this reason, even when a fine pattern is placed on the reticle side, it has a size larger than on the wafer side, and an extremely high machining accuracy is not required in most cases. Accordingly, the fine pattern can be placed on the reticle side without any serious problems.

SUMMARY OF THE INVENTION

An exposure apparatus according to an aspect of the present invention includes a projection optical system that projects a pattern image of a reticle onto an object to be exposed; and an interferometer for measuring an optical characteristic of the projection optical system. The interferometer includes a mask placed on an object plane side of the projection optical system, the mask shaping a wavefront of light emitted from a light source into an ideal wavefront; a detector for detecting the light passing through the projection optical system; and an optical element placed between the mask and the projection optical system or between the projection optical system and the detector. The detector detects interference fringes (an interferogram) formed by interference between a reflected component of the light reflected by the optical element and a transmitted component of the light passing through the optical element.

A device manufacturing method according to another aspect of the present invention includes the steps of exposing the object by the above-described exposure apparatus; and developing the exposed object.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to help explain the principles of the invention.

FIGS. 10A to 10I are explanatory views showing structure examples of substrates.

DESCRIPTION OF THE EMBODIMENTS

Exemplary embodiments of the present invention will be described below with reference to the drawings.

First Exemplary Embodiment

Figure 1:
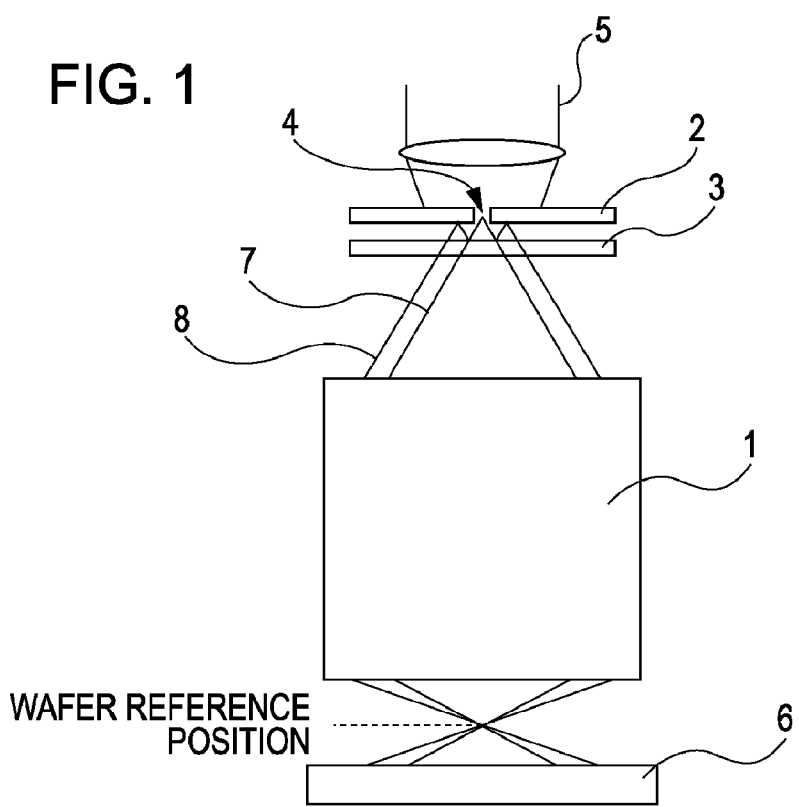
FIG. 1 is a schematic view of an exposure apparatus according to a first exemplary embodiment of the present invention.

An exposure apparatus according to a first exemplary embodiment of the present invention will be described with reference to FIG. 1. In the first exemplary embodiment, information about optical characteristics (in particular, a wavefront aberration and a Zernike coefficient) of a projection optical system is obtained on the basis of a transmitted wavefront of light passing through a substrate (optical element) and a reflected wavefront of light reflected by the substrate and a mask. In order to conduct exposure on a wafer serving as an object to be exposed, a reticle (photomask) placed on an object plane of a projection optical system 1 is illuminated with illumination light 5 from a light source, and a circuit pattern provided on the reticle is projected onto the wafer by the projection optical system 1. In contrast, in order to measure a wavefront aberration of the projection optical system 1, the reticle is replaced with a mask 2 having a pinhole 4, and a substrate 3 is placed between the mask 2 and the projection optical system 1.

The pinhole 4 is used to shape the wavefront of the illumination light 5 into an ideal wavefront. The ideal wavefront passing through the pinhole 4 is split into a transmitted wavefront 7 of light to be transmitted by the substrate 3 and a reflected wavefront 8 of light to be reflected by an upper surface of the substrate 3.

The transmitted wavefront 7 passes through the projection optical system 1, and is thereby converted into a wavefront containing information about aberration of the projection optical system 1. In contrast, the reflected wavefront 8 is reflected by the upper surface of the substrate 3 and a lower surface of the mask 2, and is thereby enlarged in the radial direction centered on the optical axis of the projection optical system 1 so as to have a larger cross-sectional area perpendicular to the optical axis than that of the transmitted wavefront 7. The enlarged reflected wavefront 8 then passes through the projection optical system 1. The transmitted wavefront 7 and the reflected wavefront 8 passing through the projection optical system 1 are focused onto or near an image plane (wafer reference position) of the projection optical system 1.

Interference fringes (interferogram) formed by interference between the transmitted wavefront 7 and the reflected wavefront 8 are measured with a detector 6. While the detector 6 may be placed above the wafer reference position, it is placed below the wafer reference position in the first exemplary embodiment. The detector 6 can be, for example, a two-dimensional image sensor such as a CCD.

Figure 14:
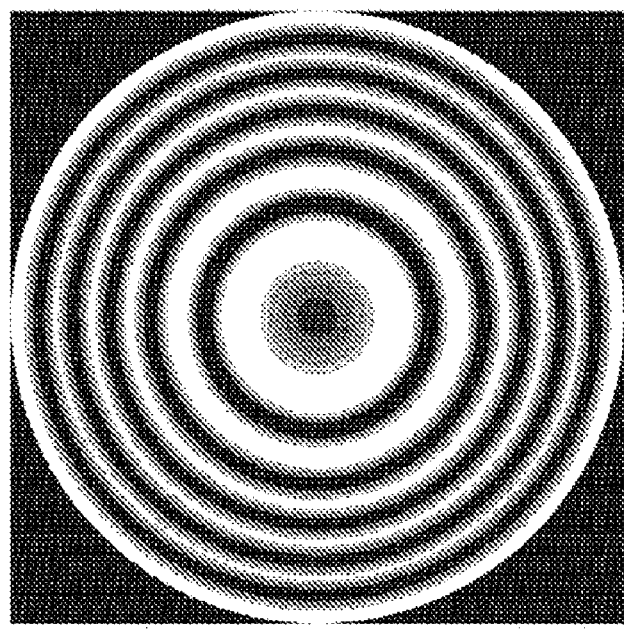
FIG. 14 is an explanatory view of interference fringes.

Interference fringes formed by interference between the concentric transmitted wavefront 7 and the reflected wavefront 8 are shown in FIG. 14.

In the first exemplary embodiment, the substrate 3 is interposed between the mask 2 and the projection optical system 1, thereby constituting a radial shearing interferometer.

The shear ratio of the transmitted wavefront 7 and the reflected wavefront 8 is determined by the distance between a reflecting surface of the substrate 3 and a reflecting surface of the mask 2 (reflecting-surface distance). However, to optimize the reflecting-surface distance depending on the shear ratio and the pitch of interference fringes, because the shear ratio increases, but the pitch decreases as the reflecting-surface distance increases.

It can be useful that the substrate 3 not only reflects exposure light, but also transmits the exposure light. Therefore, the substrate 3 is formed of a material that transmits exposure light. In order to reduce the amount of unnecessary light, it can be useful to add an antireflection coating to the lower surface of the substrate 3 and to thereby reduce reflection by the lower surface of the substrate 3.

The reflected wavefront 8 is produced by reflection at the upper surface of the substrate 3 and the lower surface of the mask 2. For this reason, when the reflectances of the surfaces are too high, the intensity of reflected light increases, however, the visibility of interference fringes is sometimes reduced by the influence of multiple reflections, and high-precision wavefront measurement is impossible. In order to reduce the influence of multiple reflections for precise measurement, it is appropriate to optimize the reflectances of the reflecting surfaces so that the visibility of the interference fringes is approximately 0.3.

For example, a reflection enhancing coating is added to the lower surface of the mask 2 so that the intensity reflectance becomes approximately 50%. When the upper surface of the substrate 3 is formed of a glass substrate, the intensity reflectance is 4%, and therefore, the visibility of interference fringes becomes approximately 0.3. This is satisfactory. It can be more useful to add an antireflection coating to the lower surface of the substrate 3 in order to reduce reflection by the lower surface.

Normally, the lower surface of the reticle for exposure has a circuit pattern, and a chromium oxide coating or a chromium coating is applied thereon. When a pinhole is provided in a part of the exposure reticle, a wavefront can be measured simply by moving the reticle with a reticle stage to adjust the position of the pinhole without replacing the reticle with the mask 2 for measurement. In this case, the intensity reflectance of the lower surface of the reticle is approximately 30% when a chromium oxide coating is provided, and approximately 8% when a chromium coating is provided. The reflectance of the upper surface of the substrate 3 may be optimized in conjunction with the visibility of interference fringes. Of course, the reflectance of the reflecting surface is not limited to the above values, and is optimized according to the configuration. Further, a measurement mask may always be provided on the reticle stage outside a reticle chuck that holds the reticle.

In the first exemplary embodiment, an interferometer can be constructed in the exposure apparatus by replacing an exposure reticle with a measurement mask having a pinhole, inserting a substrate, and placing a detector at a desired position. Therefore, a common-path interferometer, which has a quite simple structure and is resistant to vibration, can be constructed in the exposure apparatus.

Further, since a directional fine pattern is not used in the first exemplary embodiment, the measurement operation does not need to be repeated a plurality of times, but is performed only once. Therefore, the accuracy in measuring astigmatism is not decreased by misalignment of patterns formed in a plurality of measurement operations, and errors are not increased by repeating driving operations. Consequently, high-precision measurement is possible.

In the exposure apparatus of the first exemplary embodiment, a fine pattern is placed only at the pinhole on the object plane side of the projection optical system 1, and does not need to be placed on the image plane side of the projection optical system 1. Therefore, even when the numerical aperture is high, it is possible to easily and precisely measure a wavefront aberration of the projection optical system 1 over the entire pupil plane of the projection optical system. Strictly, two interfering light beams are slightly shifted from each other because they are split before passing through the projection optical system 1. However, the measured value does not particularly need to be corrected, and a wavefront aberration of the projection optical system 1 can be measured with high precision. Since the amount of shift between the two light beams can be calculated from the incident angle of the illumination light 5 on the substrate 3 and the reflecting-surface distance, the measured value may be corrected on the basis of the calculation result.

In order to precisely extract wavefront phase information about the projection optical system 1 on the basis of an interference fringe pattern obtained by the detector 6 of the interferometer, for example, an electronic Moiré method can be used. When the radial shearing interferometer is used as in the first exemplary embodiment, interference fringes are obtained by misalignment in the radial direction between the wavefronts having the same aberration information. Therefore, interference fringes obtained in the first exemplary embodiment contain information about a difference in aberration.

In an electronic Moiré method, an image of the interference fringe pattern of an object to be measured (projection optical system 1) having carrier fringes is formed by the interferometer, and is observed by the detector 6. On the other hand, signals of three or more reference patterns, which have the same frequency as that of the images of the interference fringes and are phase-shifted by a predetermined amount, are generated in a computer, and are multiplied by signals of the obtained images of the interference fringes. Three or more Moiré patterns are obtained by extracting low-frequency components from the signals obtained by multiplication, and a phase distribution is obtained from the Moiré patterns. Since fringe phases can be calculated from one pattern containing carrier fringes in this method, a driving mechanism for the substrate is not necessary, vibration resistance is high, and high-speed processing is possible.

In order to measure the optical characteristics of the projection optical system, it can be useful to separate error components resulting from the material and thickness of the substrate. For that purpose, error components are obtained beforehand, and are subtracted as system errors from the measured value.

Second Exemplary Embodiment

Figure 2:
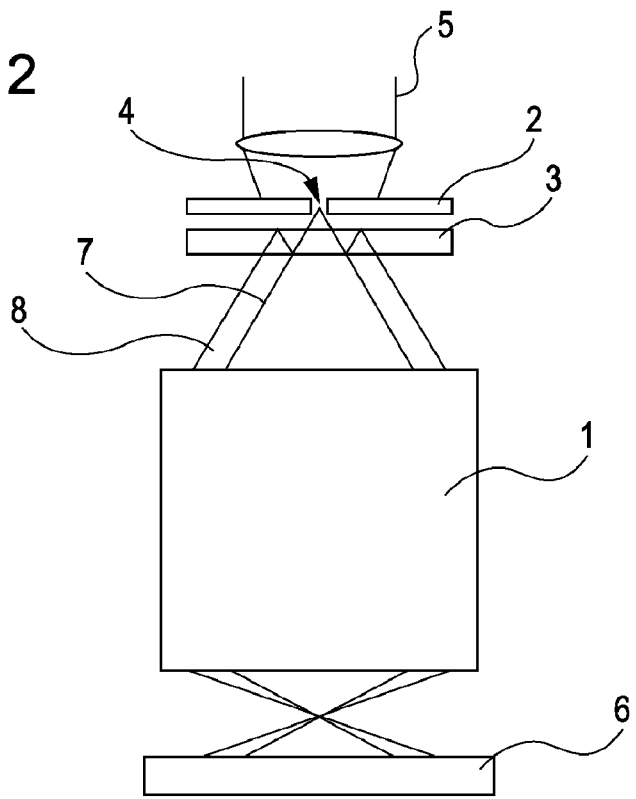
FIG. 2 is a schematic view of an exposure apparatus according to a second exemplary embodiment of the present invention.

An exposure apparatus according to a second exemplary embodiment of the present invention will be described with reference to FIG. 2. The same components as those in FIG. 1 are denoted by the same reference numerals, and descriptions thereof are omitted.

In the second exemplary embodiment, interference fringes are formed by interference between a transmitted wavefront 7 and a reflected wavefront 8 that is generated by reflection at upper and lower surfaces of a substrate 3, and are detected with a detector 6, thereby measuring a wavefront aberration of a projection optical system 1.

Similarly to the first exemplary embodiment, one substrate 3 is interposed between a mask 2 and the projection optical system 1, and other structures are similar to those in the first exemplary embodiment. It can be useful to add an antireflection coating on a lower surface of the mask 2 in order to reduce the reflectance of the lower surface.

Unlike the first exemplary embodiment, the reflected wavefront 8 is not reflected by the mask 2. Therefore, information about the centers of the interference fringes is not lost even when the mask 2 has a pinhole.

Third Exemplary Embodiment

Figure 3:
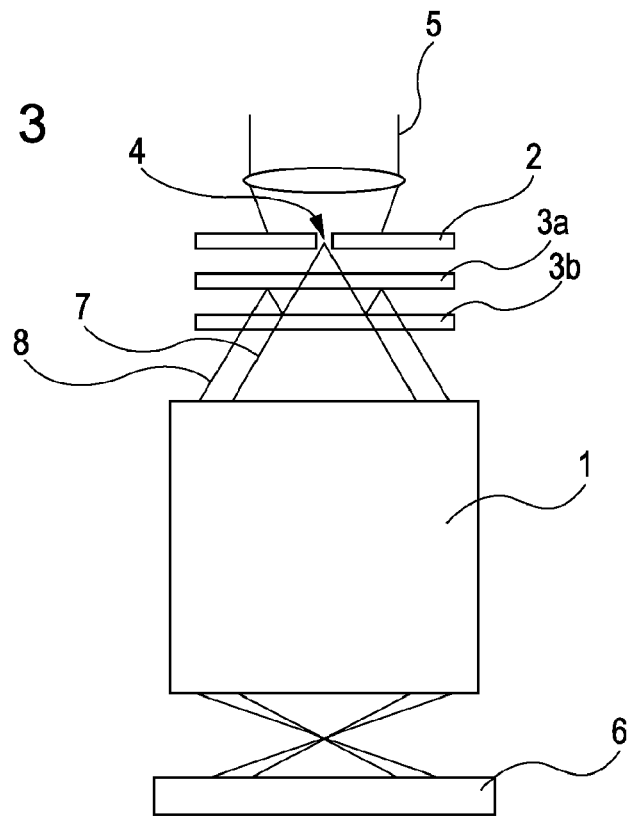
FIG. 3 is a schematic view of an exposure apparatus according to a third exemplary embodiment of the present invention.

An exposure apparatus according to a third exemplary embodiment of the present invention will be described with reference to FIG. 3. The same components as those in FIG. 1 are denoted by the same reference numerals, and descriptions thereof are omitted.

In the third exemplary embodiment, substrates 3a and 3b are interposed between a mask 2 and a projection optical system 1. Interference fringes are formed by interference between a transmitted wavefront 7 and a reflected wavefront 8 produced by reflection at the substrates 3a and 3b, and are detected with a detector 6, thereby measuring a wavefront aberration of the projection optical system 1.

The reflected wavefront 8 is produced by reflection of light at a lower surface of the substrate 3a on the mask side and an upper surface of the substrate 3b on the side of the projection optical system 1. It can be useful to attach antireflection coating on the other surfaces of the substrates 3a and 3b in order to remove unnecessary light. It can also be useful to optimize the reflectances of the lower surface of the substrate 3a and the upper surface of the substrate 3b in conjunction with multiple reflections and visibility of interference fringes, as described in the first exemplary embodiment.

With the interferometer of the third exemplary embodiment, information about the centers of the interference fringes is not lost even when the mask 2 has a pinhole, and the reflectance can be freely determined. This achieves a high degree of flexibility.

The exposure apparatus of the third exemplary embodiment allows a wavefront aberration of the projection optical system 1 to be easily and precisely measured without placing a fine pattern on the image plane side of the projection optical system 1.

While the reflected wavefront 8 is produced by reflecting a part of illumination light 5 by the lower surface of the substrate 3a and the upper surface of the substrate 3b in the third exemplary embodiment, the reflecting surfaces are not limited thereto. It can be useful to provide a coating having an optimized reflectance on the reflecting surfaces and to provide an antireflection coating on the other surfaces.

Fourth Exemplary Embodiment

Figure 4:
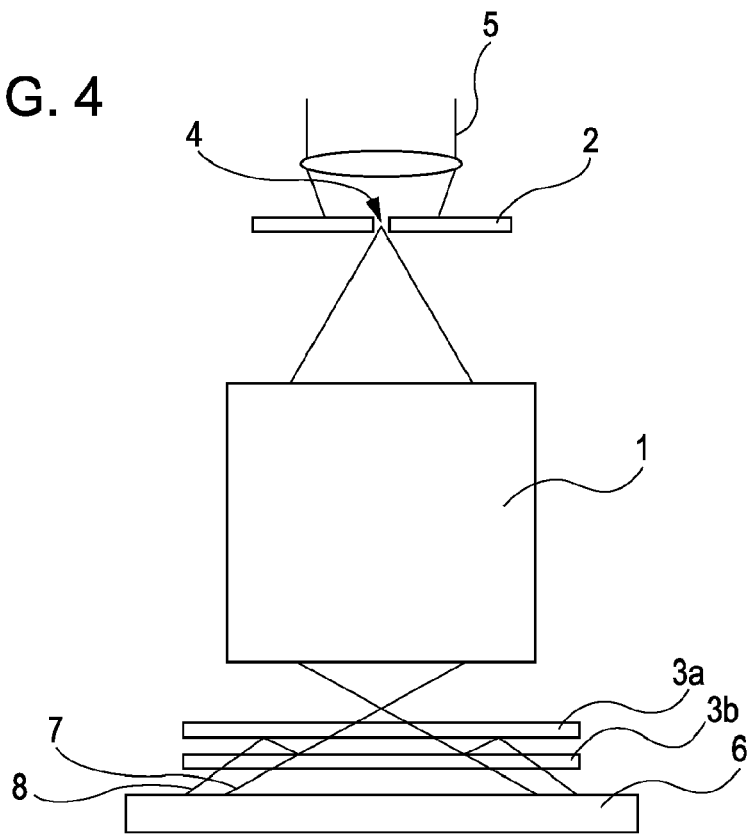
FIG. 4 is a schematic view of an exposure apparatus according to a fourth exemplary embodiment of the present invention.

An exposure apparatus according to a fourth exemplary embodiment of the present invention will be described with reference to FIG. 4. The same components as those in FIG. 1 are denoted by the same reference numerals, and descriptions thereof are omitted.

In the fourth exemplary embodiment, substrates 3a and 3b are interposed between a projection optical system 1 and a detector 6. Interference fringes are formed by interference between a transmitted wavefront 7 and a reflected wavefront 8 produced by light reflection between the substrates 3a and 3b, and are detected with the detector 6, thereby measuring a wavefront aberration of the projection optical system 1.

The reflected wavefront 8 is produced by reflection at a lower surface of the substrate 3a on the projection optical system side and an upper surface of the substrate 3b on the detector side. It can be useful to provide antireflection coating on the other surfaces of the substrates 3a and 3b in order to remove unnecessary light. It can also be useful to optimize the reflectances of the two reflecting surfaces in conjunction with multiple reflections and visibility of interference fringes, as described in the first exemplary embodiment.

In the above-described exposure apparatus of the fourth exemplary embodiment, a wavefront aberration of the projection optical system 1 can be easily and precisely measured without placing a fine pattern on the image plane side of the projection optical system 1.

While the reflected wavefront 8 is produced by reflecting a part of illumination light 5 by the lower surface of the substrate 3a and the upper surface of the substrate 3b in the fourth exemplary embodiment, the reflecting surfaces are not limited thereto. It can be useful to provide a coating having an optimized reflectance on the reflecting surfaces and to provide an antireflection coating on the other surfaces.

Fifth Exemplary Embodiment

Figure 5:
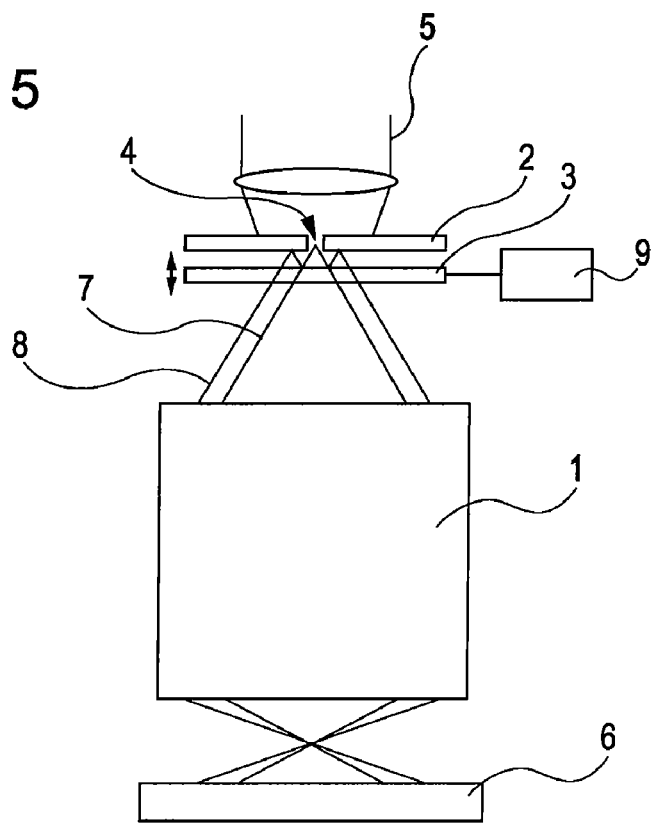
FIG. 5 is a schematic view of an exposure apparatus according to a fifth exemplary embodiment of the present invention.

An exposure apparatus according to a fifth exemplary embodiment of the present invention will be descried with reference to FIG. 5. The same components as those in FIG. 1 are denoted by the same reference numerals, and descriptions thereof are omitted.

In the above-described first exemplary embodiment, wavefront phase information about the projection optical system 1 is precisely calculated from an image of the interference fringes obtained with the detector 6, for example, by an electronic Moiré method. In the fifth exemplary embodiment, phase information is calculated by phase shifting.

Phase shifting is a method for precisely calculating phase information from a plurality of phase-shifted images of the interference fringes.

In the configuration shown in FIG. 5, a plurality of phase-shifted images are obtained with a detector 6 by moving a substrate 3 along the optical axis of a projection optical system 1 by a driving unit 9 serving as a driving device. When the substrate 3 is moved along the optical axis, the optical path length changes by a value corresponding to twice the amount of movement. For example, the substrate 3 is moved at a pitch of ⅛λ in order to achieve phase shifting at a pitch of ¼λ. In this way, the reflecting surface needs to be moved by a distance shorter than the wavelength, and can be moved by a piezoelectric element.

While phase shifting is performed by moving the substrate 3 in the fifth exemplary embodiment, the driving structure is not limited thereto because it is satisfactory as long as the reflecting-surface distance can be changed. For example, a mask 2 may be moved. Alternatively, when a plurality of substrates are provided as in the third and fourth exemplary embodiments, any one of the substrates may be moved.

Sixth Exemplary Embodiment

Figure 6:
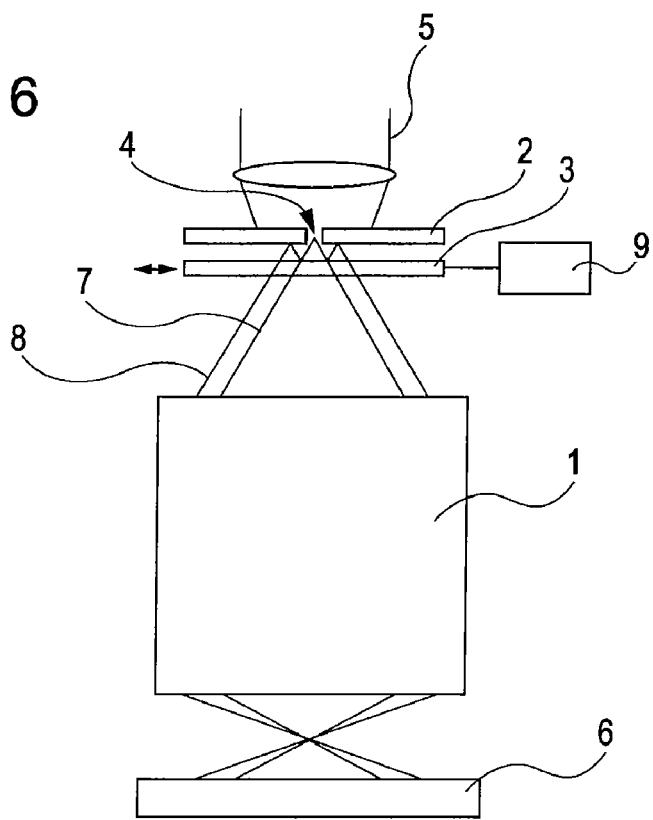
FIG. 6 is a schematic view of an exposure apparatus according to a sixth exemplary embodiment of the present invention.

An exposure apparatus according to a sixth exemplary embodiment of the present invention will be described with reference to FIG. 6. The same components as those in FIG. 5 are denoted by the same reference numerals, and descriptions thereof are omitted.

Figure 16:
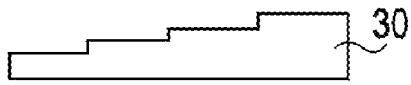
FIG. 16 is a schematic view of a substrate having a non-uniform thickness.

In the sixth exemplary embodiment, the thickness of a substrate 30 is nonuniform, as shown in FIG. 16, and phase shifting is performed by moving the substrate 30 by a driving unit 9 in a direction perpendicular to the optical axis of a projection optical system 1.

Steps are provided on the substrate 30 corresponding to the driving amount. For example, the pitch of the steps is set at ⅛λ in order to perform phase shifting at a pitch of ¼λ.

A pinhole may be provided in each of the steps of the substrate 30, and the substrate 30 and a mask having a plurality of pinholes may be moved together by a reticle stage in the direction perpendicular to the optical axis. In this case, a driving device for driving only the substrate 30 along the optical axis is not necessary.

Since the thickness of the substrate 30 is not uniform because of the steps, correction is made every time the substrate 30 is moved.

Seventh Exemplary Embodiment

Figure 7:
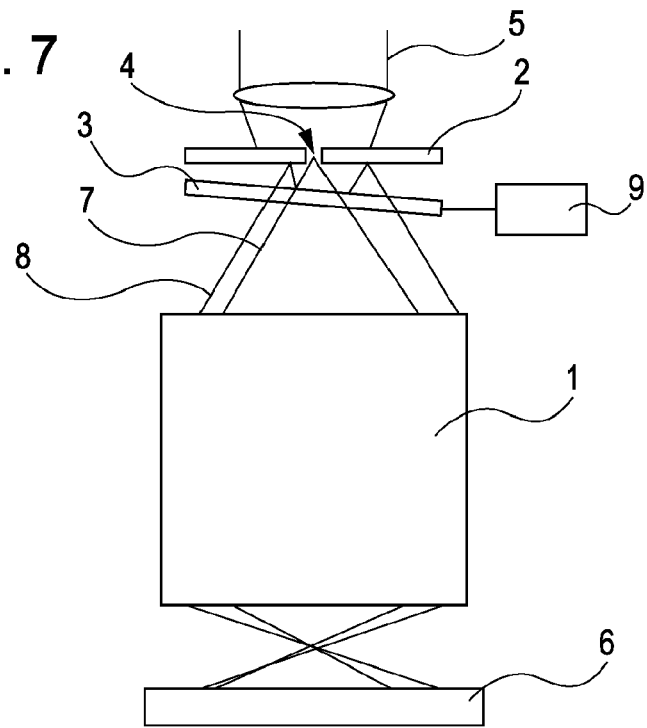
FIG. 7 is a schematic view of an exposure apparatus according to a seventh exemplary embodiment of the present invention.

An exposure apparatus according to a seventh exemplary embodiment of the present invention will be described with reference to FIG. 7. The same components as those in FIG. 5 are denoted by the same reference numerals, and descriptions thereof are omitted.

In the seventh exemplary embodiment, surfaces of a substrate 3 are not perpendicular to the optical axis of a projection optical system 1, but is slightly tilted.

Figure 15:
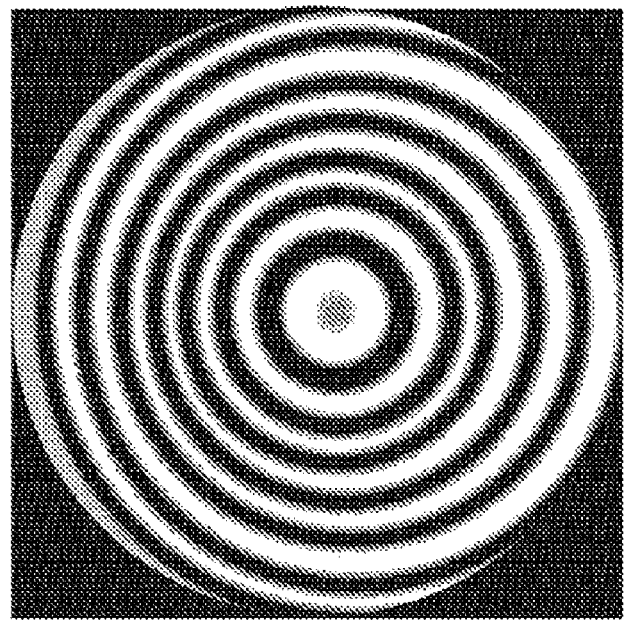
FIG. 15 is an explanatory view of interference fringes.

By tilting the substrate 3 by a driving unit 9, obtained interference fringes are changed from concentric circles to asymmetric circles, as shown in FIG. 15. That is, not only information sheared in the radial direction, but also information sheared in the lateral direction as a whole can be obtained. Sheared information about the center of the projection optical system 1 (on the optical axis), which cannot be obtained only by shearing in the radial direction, can also be obtained.

Phase shifting may be performed with a plurality of interference fringe patterns obtained by tilting the reflecting surface in a plurality of directions, or with a plurality of interference fringe patterns obtained by changing the amount of tilting.

Eighth Exemplary Embodiment

Figure 8:
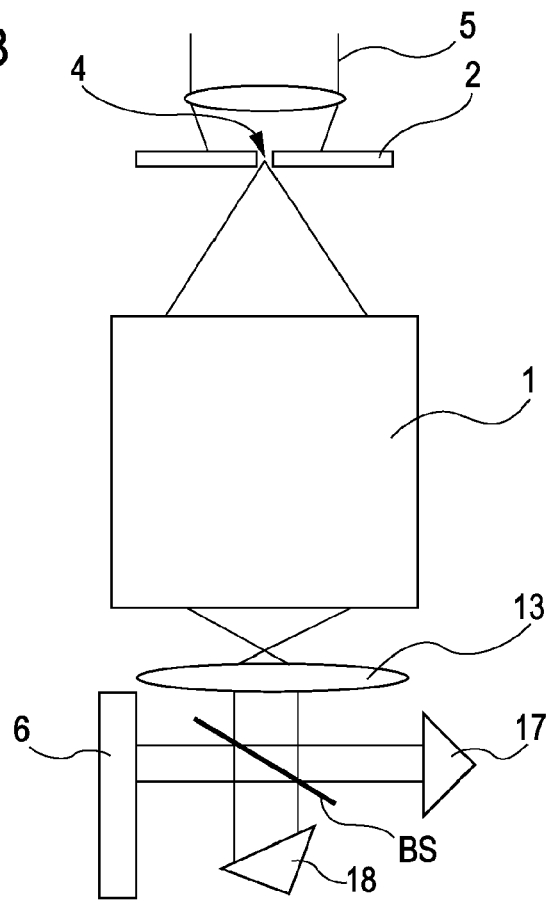
FIG. 8 is a schematic view of an exposure apparatus according to an eighth exemplary embodiment of the present invention.

An exposure apparatus according to an eighth exemplary embodiment of the present invention will be described with reference to FIG. 8.

The wavefront sheared in the radial direction is obtained in the first to sixth exemplary embodiments. In contrast, in the eighth exemplary embodiment, the wavefront is sheared not only in the radial direction, but also in the direction θ (rotational direction), that is, so-called rotational shearing is performed.

An ideal wavefront of light passing through a pinhole 4 of a mask 2 and a projection optical system 1 contains aberration of the projection optical system 1. The light from the projection optical system 1 is converted into parallel light by a lens or a lens unit 13, and the parallel light is split into two light beams by a beam splitter BS. One of the light beams is reflected by a prism 17, and the other light beam is reflected by a rotational prism 18 while the wavefront thereof is slightly turned in the direction θ. Interference fringes are formed by interference between the two light beams, and are measured with a detector 6.

The rotational prism 18 may be formed of any member that is optimized to relatively turn reflected light from the prism 17 and reflected light from the rotational prism 18, for example, a roof prism, a corner cube, or an image rotator.

While the first to eighth exemplary embodiments of the present invention have been described above, it should be noted that the present invention is not limited to the exemplary embodiments, and that various modifications and alterations are possible within the scope of the invention.

Figure 9A:
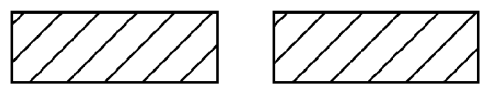
FIGS. 9A to 9F are explanatory views showing structure examples of masks each having a pinhole.
Figure 9B:
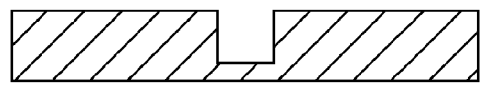
Figure 9C:
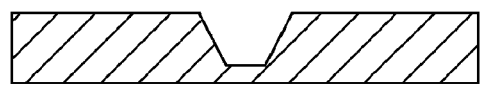
Figure 9D:
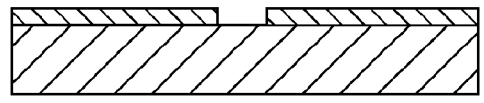
Figure 9E:
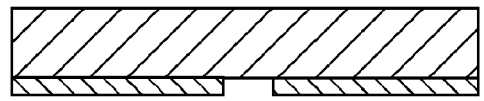
Figure 9F:
Figure 10D:
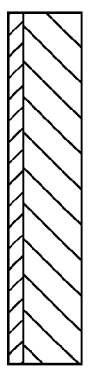
Figure 10C:
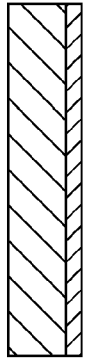
Figure 10B:
Figure 10G:
Figure 10F:
Figure 10I:
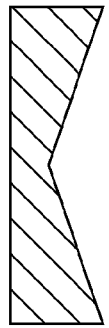
Figure 10E:
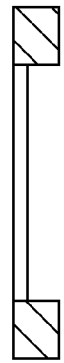
Figure 10H:

For example, although the pinhole may be a through hole, as shown in FIG. 9A, reflected light cannot be obtained at the center (on the optical axis) of the projection optical system 1 in this case, and consequently, information cannot be acquired. In order to avoid this problem, the pinhole may be a concavity, as shown in FIGS. 9B and 9C, or may be obtained by forming an opening in a part of a coating, as shown in FIG. 9D. In these cases, light is also reflected at the center, and therefore, information about the center is obtained. When an opening is formed in a part of a coating, as shown in FIG. 9E, a pinhole can be provided in a part of a normal reticle. Further, a minute pinhole can be provided in a part of a membrane, as shown in FIG. 9F. In this case, a pinhole may be obtained by forming an opening in a coating placed on the membrane, instead of directly forming an opening in the membrane. A plurality of pinholes smaller than the resolution may be arranged so that more light can be obtained than when a single pinhole is provided and so that an ideal wavefront can be achieved. The shape of the pinhole is not limited to the above shapes, and may be appropriately determined.

While the substrate 3 is a parallel plate in the above-described first to eighth exemplary embodiments, it may be formed of any of the substrate types shown in FIGS. 10A to 10I, or by a combination of the substrates.

For example, a parallel plate (FIG. 10A) may be coated with an antireflection coating (FIG. 10C) or provided with a half mirror (FIG. 10D), as described in the exemplary embodiments. When the substrate 3 is a flat plate of wedge-shaped cross section having upper and lower surfaces that are not parallel (FIG. 10B), reflection at the lower surface of the substrate 3 can be removed, and therefore, there is no need to apply an antireflection coating on the lower surface. In this case, however, it can be useful to pay attention to, for example, flare and ghost. When a membrane (FIG. 10E) is used, spherical aberration resulting from the thickness of the substrate can be reduced. Other elements, for example, a round optical element having a uniform thickness (FIG. 10F), a hemispherical lens having an upper flat surface (FIG. 10G), a lens (FIG. 10H), and an angular optical element (FIG. 10I) may be used.

In any case, it can be useful to separate aberration of the projection optical system 1 from the optical characteristics resulting from the thickness and material of the substrate 2. Therefore, the optical characteristics of the substrate 2 are obtained beforehand, and are removed as system errors.

Figure 11A:
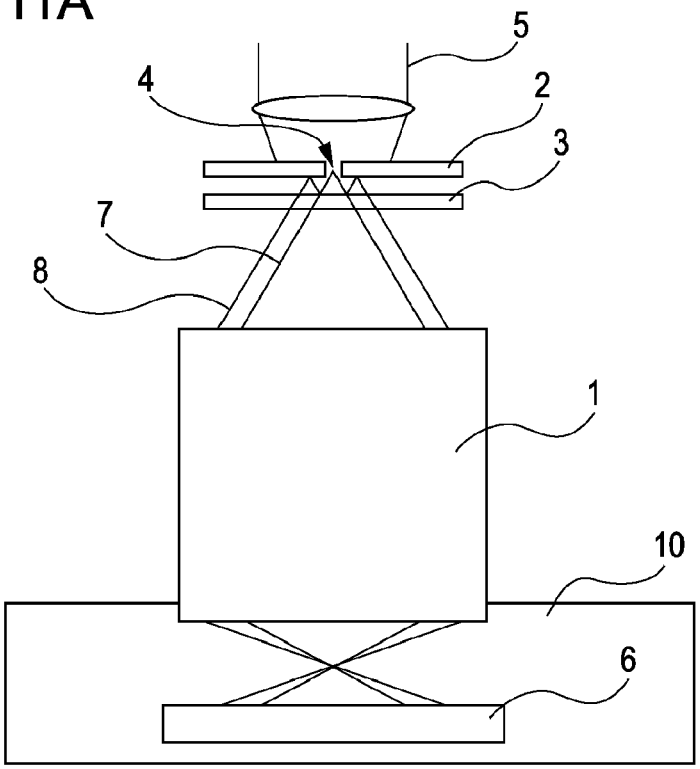
FIGS. 11A to 11C are explanatory views showing placement examples of a detector.
Figure 11B:
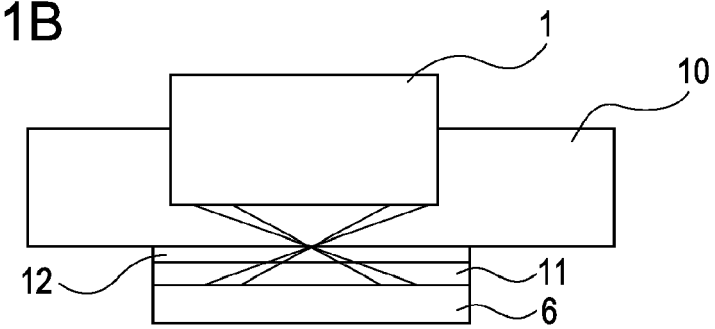
Figure 11C:
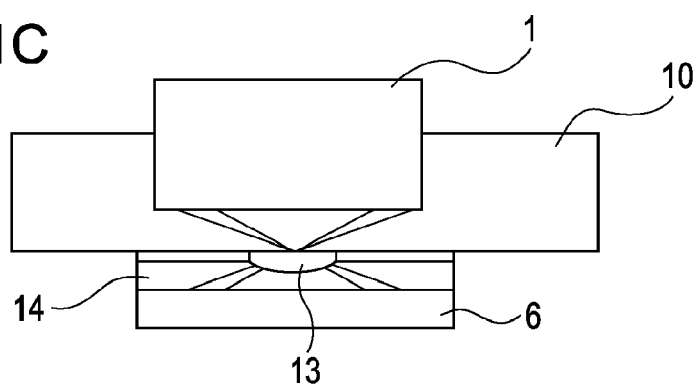

In the first to eighth exemplary embodiments, the detector 6 is provided in the air. In an immersion exposure apparatus in which a final plane of a projection optical system is immersed in immersion liquid, the detector 6 may be placed in the immersion liquid. In this case, however, some consideration is needed when placing the detector 6. FIGS. 11A to 11C show placement examples of the detector 6.

A coated detector 6 may be placed in immersion liquid 10, as shown in FIG. 11A, or may be placed in a sealing liquid 11 that is separated from the immersion liquid 10 by a sealing member 12, as shown in FIG. 11B. Alternatively, the detector 6 may be sealed in a sealing liquid or air 14, and a lens or a lens unit 13 may be interposed between the immersion liquid 10 and the sealing liquid or air 14, as shown in FIG. 11C.

Figure 12A:
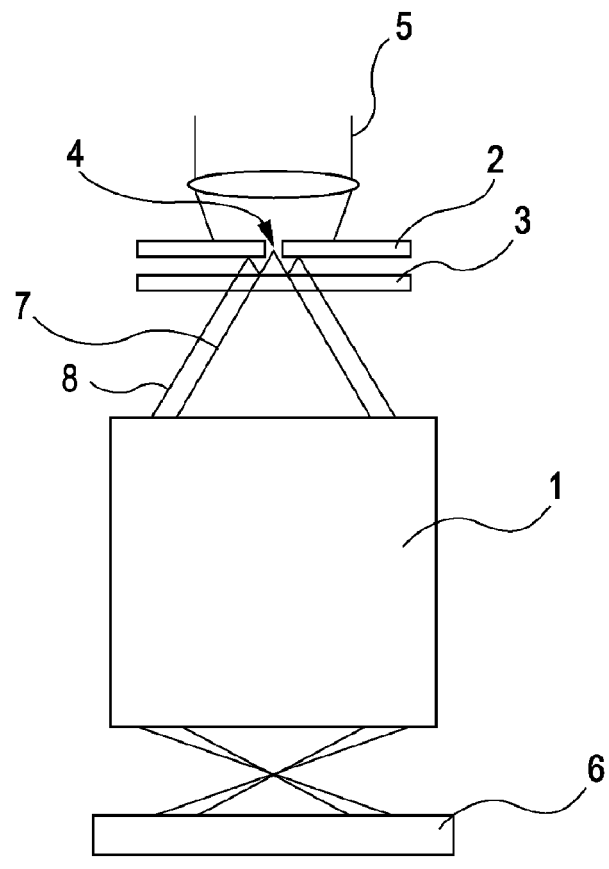
FIGS. 12A to 12D are explanatory views showing examples of ways of providing illumination.
Figure 12B:
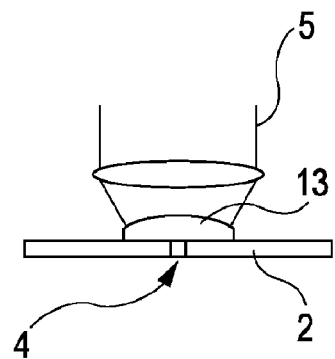
Figure 12C:
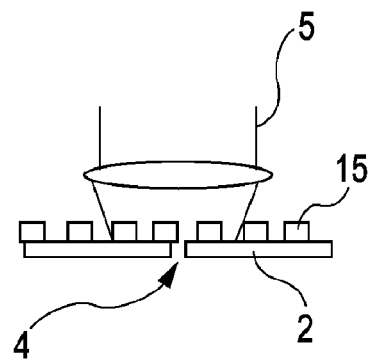
Figure 12D:
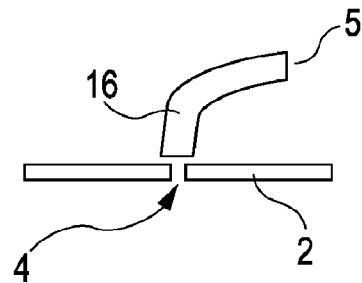

While the first to eighth exemplary embodiments adopt a normal type of illumination system shown in FIG. 12A, the present invention can provide similar advantages when applied to other various illumination systems. In the illumination system, a hemispherical lens, a lens, or a lens unit 13 may be placed before the pinhole 4, as shown in FIG. 12B, a diffraction grating 15 may be placed before the pinhole 4, as shown in FIG. 12C, or light guided by a fiber 16 may be introduced into the pinhole 4, as shown in FIG. 12D. The structures shown in FIGS. 12B, 12C, and 12D allow more light to be guided into the pinhole 4 than in the structure shown in FIG. 12A.

While the light source for exposure is also used for the interferometer in the above exemplary embodiments, another light source that emits light having almost the same wavelength of the light from the exposure light source may be used.

Figure 13:
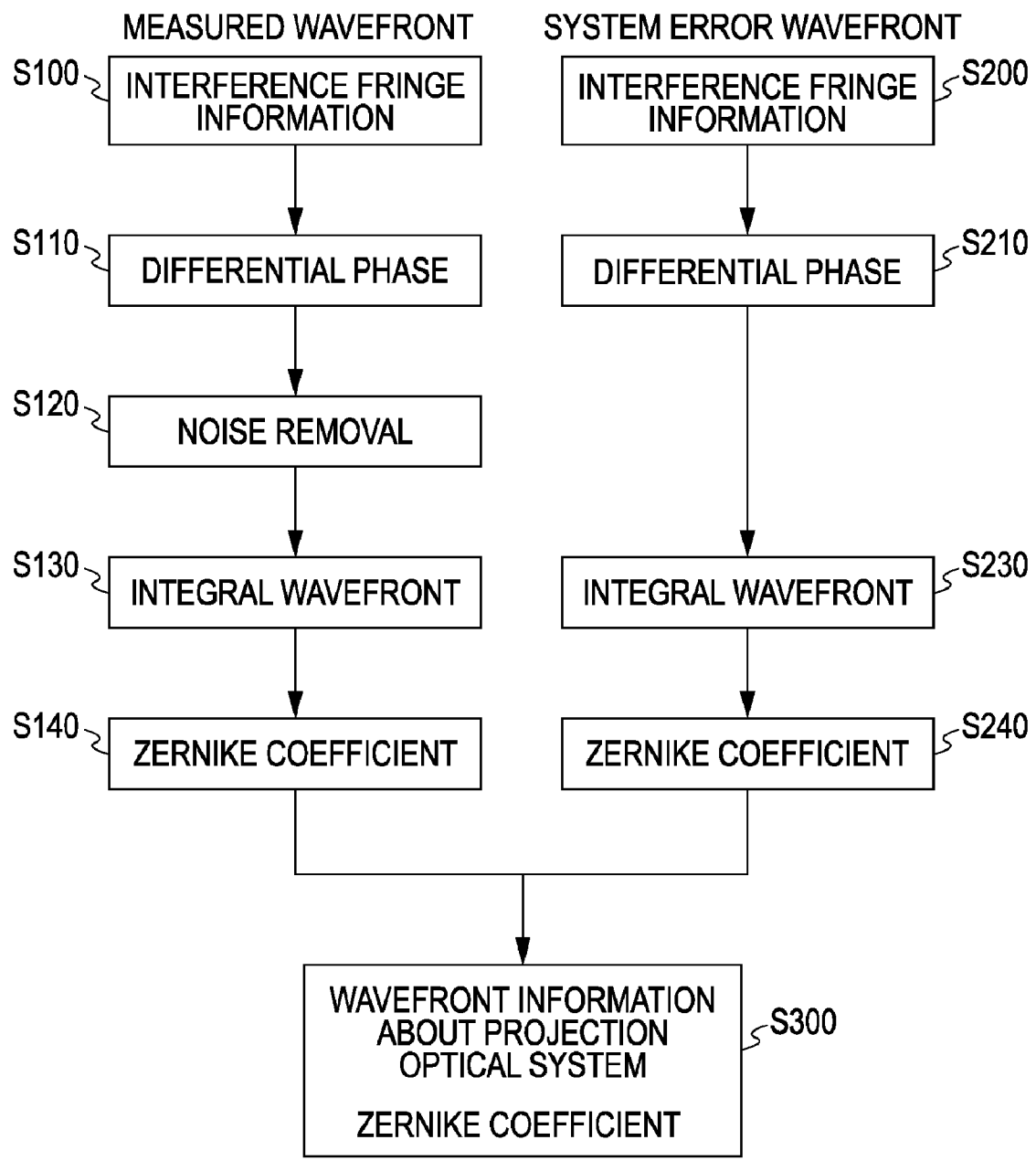
FIG. 13 is a flowchart showing a processing procedure.

A processing procedure for obtaining information about the wavefront of the projection optical system from the interference fringe pattern information obtained in the first to eighth exemplary embodiments will be described with reference to FIG. 13.

First, interference fringes are measured in the manner described in the first to eighth exemplary embodiments (Step S100). A differential phase is calculated from the measured interference fringes, for example, by an electronic Moiré method or phase shifting (Step S110). After noise rejection is performed (Step S120), an integral wavefront is calculated from the differential phase (Step S130), and a Zernike coefficient of a measured wavefront is calculated (Step S140).

A description will now be given of a system error wavefront.

A transmitted wavefront and a reflected wavefront that form interference fringes are originally different in radius of curvature. For this reason, even if the projection optical system has no aberration, a system error wavefront, such as large spherical aberration resulting from the difference in radius of curvature, is measured as interference fringes. Moreover, since the substrate is inserted, a system error wavefront resulting from the shape or the like of the substrate is also measured.

Accordingly, interference fringe information about system error wavefronts resulting from the difference in radius of curvature between the transmitted wavefront and the reflected wavefront and the shape of the substrate is calculated (Step S200). In a manner similar to that for the measured wavefront, a differential phase is calculated (Step S210), an integral wavefront is calculated from the differential phase (Step S230), and a Zernike coefficient of the system error wavefront is calculated (Step S240). By subtracting the Zernike coefficient of the system error wavefront from the Zernike coefficient of the measured wavefront, wavefront information (Zernike coefficient) about the projection optical system can be obtained finally (Step S300).

While the difference between the information about the measured wavefront and the information about the system error wavefront is calculated from the Zernike coefficients herein, the wavefront aberration may be found by calculating a difference between the differential phases or between the integral wavefronts. Further, the information about the system error wavefront may be periodically found, not in every measuring operation.

Alternatively, information about the system error wavefront may be calculated or measured, and stored beforehand, and the information about the measured wavefront may be corrected on the basis of the stored information.

Figure 17:
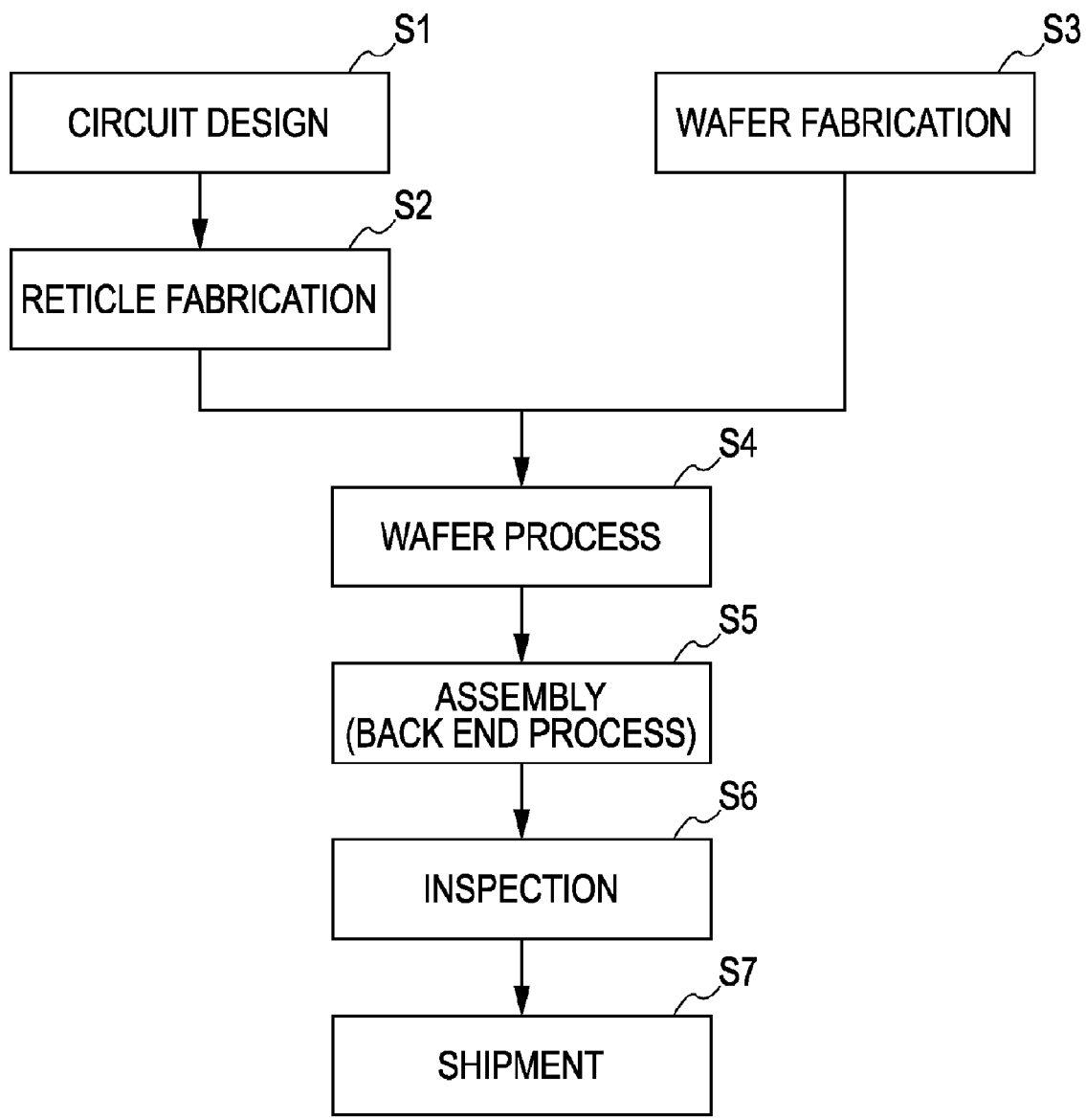
FIG. 17 is a flowchart showing a device manufacturing procedure.

FIG. 17 is a flowchart showing a manufacturing procedure for semiconductor devices (e.g., semiconductor chips such as ICs and LSIs, liquid crystal panels, and CCDs) In Step S1 (circuit design), a circuit pattern of a semiconductor device is designed. In Step S2 (reticle fabrication), a reticle (photomask) having the designed circuit pattern is fabricated. In Step S3 (wafer fabrication), a wafer is made of, for example, silicon. In Step S4 (wafer process) called a front end process, an actual circuit is formed on the wafer by using the prepared reticle and wafer by lithography. In Step S5 (assembly) called a back end process, a semiconductor chip is produced by using the wafer fabricated in Step S4. The back end process includes, for example, an assembly step (dicing, bonding) and a packaging step (chip encapsulation). In Step S6 (inspection), the semiconductor chip produced in Step S5 is subjected to various inspections such as an operation confirmation test and a durability test. A semiconductor device is completed through the above steps, and is then shipped (Step S7).

Figure 18:
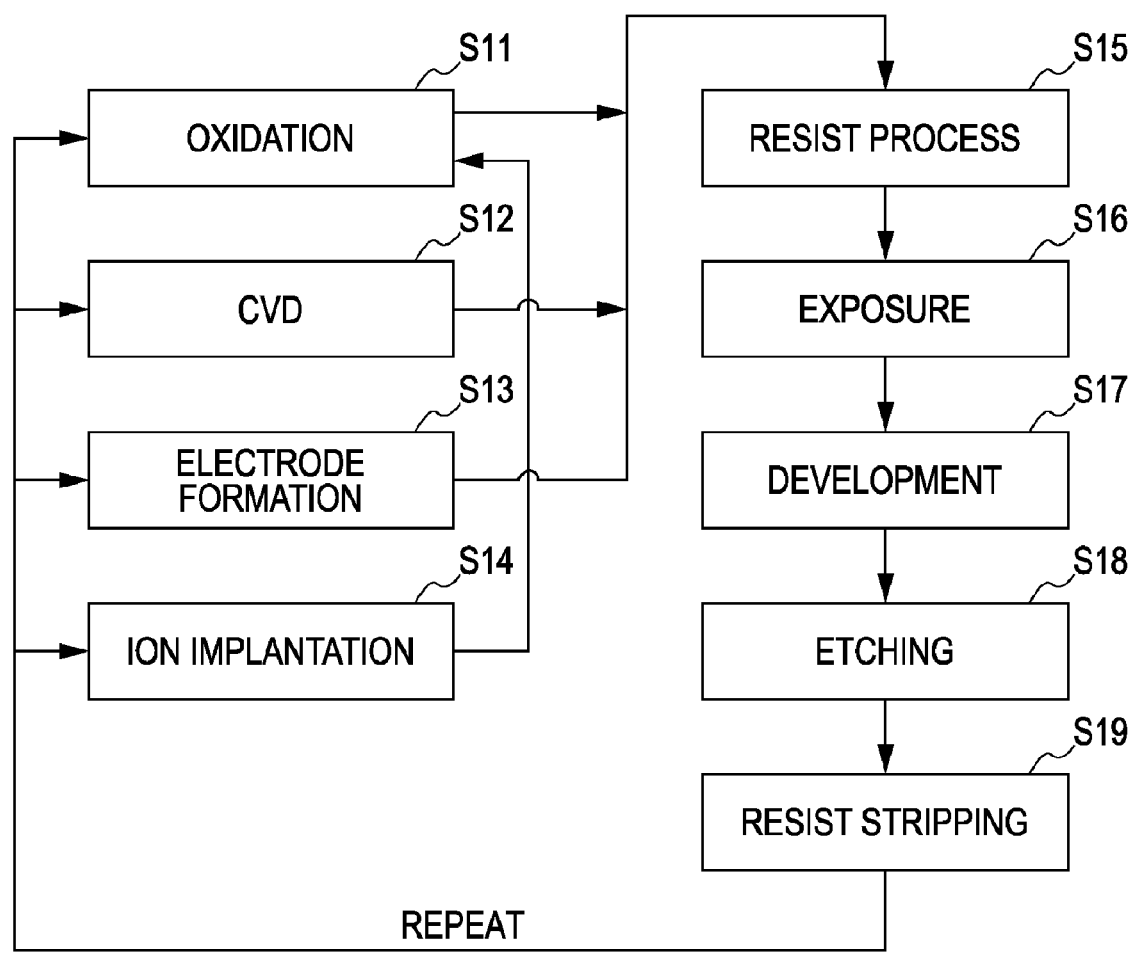
FIG. 18 is a flowchart showing a wafer process shown in FIG. 17.

FIG. 18 is a detailed flowchart of the wafer process. In Step S11 (oxidation), the surface of the wafer is oxidized. In Step S12 (CVD), an insulating film is formed on the surface of the wafer. In Step S13 (electrode formation), electrodes are formed on the wafer by vapor disposition. In Step S14 (ion implantation), ions are implanted into the wafer. In Step S15 (resist coating), a resist (photosensitive material) is applied on the wafer. In Step S16 (exposure), the circuit pattern of the mask is transferred onto the wafer by exposure with the above-described projection exposure apparatus. In Step S17 (development), the exposed wafer is developed. In Step S18 (etching), a portion other than the developed resist is removed. In Step S19 (resist stripping), the resist, which has become unnecessary after etching, is removed. By repeating these steps, circuit patterns are formed on the wafer.

The manufacturing method of the present invention can manufacture highly integrated devices that have not been obtained before.

As many apparently widely different exemplary embodiments of the present invention can be made without departing from the spirit and scope thereof, it is to be understood that the invention is not limited to the specific exemplary embodiments thereof except as defined in the claims.

This application claims the priority of Japanese Application No. 2005-212917 filed Jul. 22, 2005, which is hereby incorporated by reference herein in its entirety.

What is claimed is:

1. An exposure apparatus comprising:
a projection optical system that projects a pattern image of a reticle onto an object to be exposed; and
a shearing interferometer configured to measure an optical characteristic of the projection optical system,
wherein the shearing interferometer includes:
a mask placed on an object plane side of the projection optical system, the mask shaping a wavefront of light emitted from a light source into a spherical wavefront;
a detector configured to detect the light passing through the projection optical system;
an optical element placed between the mask and the projection optical system or between the projection optical system and the detector, the optical element has a splitting surface configured to split light from the mask into a reflected beam and a transmitted beam; and
a reflecting surface adapted to reflect the reflected beam, wherein the detector detects interference fringes formed by interference between a first light beam and a second light beam, the first light beam being transmitted by the splitting surface and the projection optical system without being reflected by the splitting surface, the second light beam being transmitted by the splitting surface and the projection optical system after being reflected by the splitting surface and the reflecting surface.

2. The exposure apparatus according to claim 1, wherein the optical element is placed between the mask and the projection optical system and is arranged such that the reflecting surface is on the optical element side of the mask, and the beam reflected by the splitting surface enters the projection optical system after being reflected by the reflecting surface.

3. The exposure apparatus according to claim 2, wherein an antireflection coating is provided on a surface of the optical element facing the projection optical system.

4. The exposure apparatus according to claim 1, wherein the reflecting surface is a surface of the optical element on the mask side and the splitting surface is a surface of the optical element on the opposite side to the mask side, and the light beam reflected by the splitting surface enters the projection optical system after being reflected by the reflecting surface.

5. The exposure apparatus according to claim 1, wherein the optical element includes a first optical element and a second optical element sequentially arranged from the mask side, the first optical element having the reflecting surface and the second optical element being configured to split light into a reflected beam and a transmitted beam.

6. The exposure apparatus according to claim 1, further comprising:

a driving device configured to move the optical element along an optical axis of the projection optical system.

7. The exposure apparatus according to claim 1, further comprising:

a driving device configured to move the optical element in a direction perpendicular to the optical axis of the projection optical system, wherein the optical element includes regions arranged along the optical axis and having different thicknesses.

8. The exposure apparatus according to claim 7, wherein the difference between the thicknesses in the optical element is smaller than a wavelength of the light from the light source.

9. The exposure apparatus according to claim 1, further comprising:

driving device for tilting the optical element.

10. A device manufacturing method comprising the steps of:

exposing an object by an exposure apparatus; and developing the exposed object, wherein the exposure apparatus includes:

a projection optical system that projects a pattern image of a reticle onto the object; and a shearing interferometer configured to measure an optical characteristic of the projection optical system, wherein the shearing interferometer includes:

a mask placed on an object plane side of the projection optical system, the mask shaping a wavefront of light from a light source into a spherical wavefront;

a detector configured to detect the light passing through the projection optical system;

an optical element placed between the mask and the projection optical system or between the projection optical system and the detector, the optical element has a splitting surface configured to split light from the mask into a reflected beam and a transmitted system; and a reflecting surface adapted to reflect the reflected beam, wherein the detector detects interference fringes formed by interference between a first light beam and a second light beam, the first light beam being transmitted by the splitting surface and the projection optical system without being reflected by the splitting surface, the second light beam being transmitted by the splitting surface and the projection optical system after being reflected by the splitting surface and the reflecting surface.

* * * * *